Aug. 23, 1960 C. A. ARTZ 2,950,458

PRINTED CIRCUIT CONNECTOR

Original Filed July 1, 1955

INVENTOR.
CHARLES A. ARTZ

BY J. D. Douglas

HIS ATTORNEY

United States Patent Office 2,950,458

Patented Aug. 23, 1960

2,950,458

PRINTED CIRCUIT CONNECTOR

Charles A. Artz, Glen Ellyn, Ill., assignor to Admiral Corporation, Chicago, Ill., a corporation of Delaware Continuation of application Ser. No. 519,325, July 1, 1955. This application July 31, 1959, Ser. No. 830,953

1 Claim. (Cl. 339—217)

The present invention relates to a connector for providing an electrical circuit between two or more printed conductors which connector may also serve as a terminal for connecting the printed circuit to other parts of electrical apparatus associated therewith.

This application is a continuation of application Serial No. 519,325 filed July 1, 1955, now abandoned.

As is now well known, printed circuits for electrical apparatus and particularly electronic devices, such as radios, hearing aids, television sets, and measuring and control equipment, are being extensively utilized to provide uniformity of production and to reduce the size and the cost of such apparatus.

Printed electrical circuits, or parts for such circuits, are formed upon a plate having electrical insulating properties, such as a thin plate formed of steatite, porcelain, glass or Bakelite. Fabric material which is impregnated with a resin, such as a phenolic condensation product, and molded under heat and pressure, may also be utilized. The printed circuits, or printed parts which may be connected together to form an electrical circuit, may be formed upon the insulating plate by various methods, such as by painting, spraying, chemical deposition, die stamping, cementing, dusting, or the like. The method of forming such printed circuits, or parts thereof which may be connected together to form an electrical circuit, is fully described in the literature. See, for instance, New Advances in Printed Circuits, Miscellaneous Publication 192, issued on November 22, 1948, by the Bureau of Standards.

When parts of a printed electrical circuit, such as conductors, inductors, resistors, or the like, are printed upon a plate of insulating material, it is frequently desirable to electrically connect two or more of the parts together to complete an electrical circuit and one of the objects of the present invention is to provide an improved connector for enabling an electrical connecting of two or more parts which connector also serves as a terminal for connecting the printed circuit to other parts of the apparatus.

Figure 1:
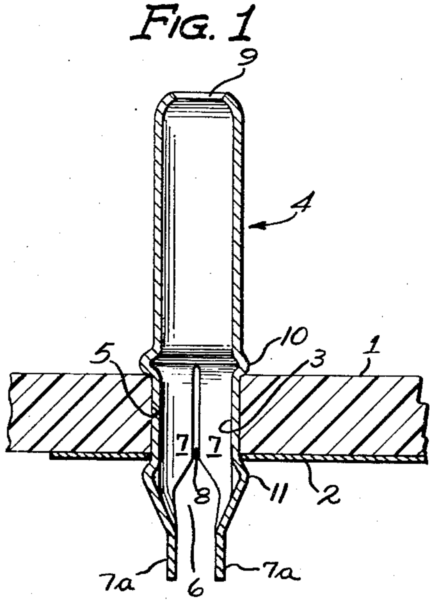
Figure 2:
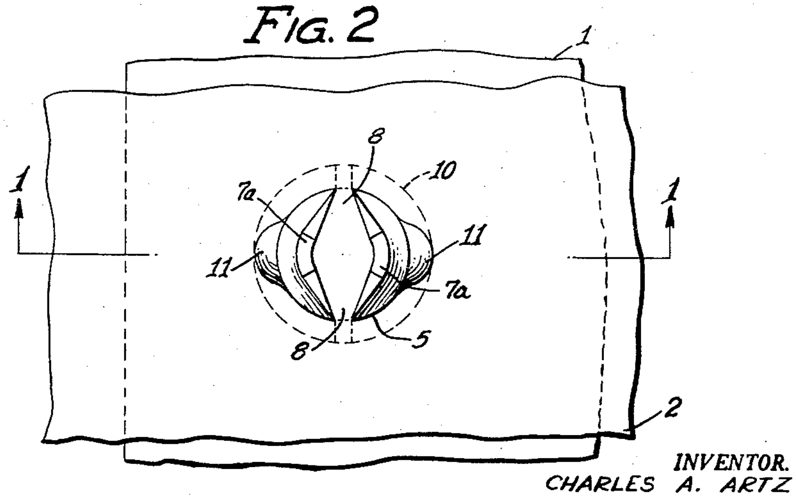

The invention will be better understood by reference to the accompanying drawings in which:

Fig. 1 is a cross sectional view of the improved connector showing it mounted in an opening in a plate of insulating material in a position to form an electrical connection between two parts printed upon the lower side wall of the plate; and Fig. 2 is a bottom plan view of the connector.

As illustrated in the drawings, the numeral 1 designates a plate formed of insulating material, such as any one of those previously mentioned, upon the bottom wall of which is printed a part 2 which is formed of a material, the conductivity of which may vary depending upon the function of the parts, and an improved connector 4 is provided, the lower portion of which is in electrical contact with the part 2 to provide an electrical circuit therewith.

In accordance with the present invention, connector 4 is preferably formed of a resilient metal having electrical conductive properties, such as copper or brass, and is so constructed that it may be readily inserted in a cylindrical opening 5 formed in the insulating plate at such a position that the conductive part 2 of the printed circuit will border and will be substantially flush with the lower portion of the insulating material surrounding the opening.

The connector 4 is formed in such a manner that it may be readily inserted in the opening 5 so that its lower portion will firmly engage the printed part 2 to provide an electrical circuit therewith. For this purpose, the lower portion of the connector is tapered downwardly and is provided with cut-out portions 6 which extend upward and connect with a slit 8 which enables the lower side portions of the connector to be biased outwardly or pressed inwardly. To increase the usefulness of the connector, an aperture 9 is also formed in the upper portion of the connector through which a wire may be inserted for making a connection thereto. To prevent the connector from being forced through the opening 5, it is provided with an annular head 10 which engages the upper portion of the insulating plate when the connector is installed in place. This head may also make contact with a printed conductor if and when there is one on top of the board. The connector 4 is also provided at its lower end portion with outwardly extending projections 11 extending beneath the conductive parts 2 to provide a firm engagement between the connector and the printed parts 2. The cylindrical portion 3 may be of varied length, which is determined by the thickness of the board.

Because the lower portion of the connector is tapered and is provided with cut-out portions 6 and slits 8, the lower end portion of the connector may be readily inserted through the opening 5, the parts spring together as the projections 11 pass through the opening 5. After the connector is inserted in place with the lower tapered side portions extending beyond the opening, however, the pressure upon side portions 7 is released, and the resiliency of the metal of which the connector is composed will force one portion of the connector in firm engagement with the conductive parts 2 to provide an electrical circuit between the two parts. When once in position the extensions 7*a* provide convenient means on the bottom of the board for attaching test clips or the like for testing purposes.

It will be noted that the upper portion of the connector extends a substantial distance above the insulating plate 1 and may be utilized as a terminal to which conductors associated with the other parts of the apparatus may be connected by the connect disconnect connector.

Having thus described my invention, I am aware that numerous and extensive departures may be made therefrom without departing from the spirit of the invention as defined in the appended claim.

I claim:

An electrical connector for attachment to a printed circuit board which is made up of an insulation board with an opening therethrough and conductive material on one face of the board at said opening, said connector comprising a tubular metal member having a bifurcated inner end for insertion into said opening made up of oppositely disposed, flexible side portions separated by cut-outs which are open at the inner extremity of the connector, said cut-outs having central slits extending substantially the thickness of said board and forming widened portions extending to the inner extremity of the connector, a laterally outwardly projecting rib spaced from the inner end of said tubular member for engagement with the opposite face of the insulation board to limit the insertion of the connector into said opening, said side portions extending from said rib to outwardly extending projections, each of said outwardly extending projections having a surface inclined towards said board and a taper extending towards the inner extremity of the connector, said side portions terminating in axial extensions extending from said tapers, said rib and said outwardly extending projections spaced apart a distance substantially equal to the width of said printed circuit board for resilient engagement of said outwardly extending projections against said conductive material on said one face of the board when the connector is positioned in said opening with said rib engaging the opposite face of the board, and said tubular member having a portion extending substantially beyond said rib in a direction along the connector away from its inner end and at its opposite end having an aperture for receiving a wire.

References Cited in the file of this patent

UNITED STATES PATENTS 2,877,441 Narozny ---------------- Mar. 10, 1959